United States Patent
Wu

(10) Patent No.: US 8,318,579 B1
(45) Date of Patent: Nov. 27, 2012

(54) METHOD FOR FABRICATING SEMICONDUCTOR DEVICE

(75) Inventor: Hsin-Ping Wu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/308,618

(22) Filed: Dec. 1, 2011

(51) Int. Cl.
*H01L 21/76* (2006.01)
*H01L 21/00* (2006.01)

(52) U.S. Cl. ...... 438/401; 438/66; 438/69; 257/E31.122

(58) Field of Classification Search .................... 438/66, 438/69, 401
See application file for complete search history.

(56) References Cited

U.S. PATENT DOCUMENTS

| | | | |
|---|---|---|---|
| 3,930,295 A | 1/1976 | Rose | |
| 4,148,048 A | 4/1979 | Takemoto | |
| 4,460,912 A | 7/1984 | Takeshita | |
| 4,533,624 A | 8/1985 | Sheppard | |
| 4,644,172 A | 2/1987 | Sandland | |
| 4,745,451 A | 5/1988 | Webb | |
| 4,951,104 A | 8/1990 | Kato | |
| 5,070,380 A | 12/1991 | Erhardt | |
| 5,241,417 A | 8/1993 | Sekiguchi | |
| 5,246,803 A | 9/1993 | Hanrahan | |
| 5,294,288 A | 3/1994 | Melpolder | |
| 5,321,297 A | 6/1994 | Enomoto | |
| 5,466,926 A | 11/1995 | Sasano | |
| 5,587,696 A | 12/1996 | Su | |
| 5,625,210 A | 4/1997 | Lee | |
| 5,650,864 A | 7/1997 | Tseng | |
| 5,830,624 A | 11/1998 | Bae | |
| 5,880,495 A | 3/1999 | Chen | |
| 5,977,535 A | 11/1999 | Rostoker | |
| 6,006,764 A | 12/1999 | Chu | |
| 6,071,826 A | 6/2000 | Cho | |
| 6,081,018 A | 6/2000 | Nakashiba | |
| 6,087,211 A | 7/2000 | Kalnitsky | |
| 6,124,200 A | 9/2000 | Wang | |
| 6,294,313 B1 | 9/2001 | Kobayashi | |
| 6,297,160 B1 | 10/2001 | Chien | |
| 6,335,791 B1 * | 1/2002 | Miyatake | 356/399 |
| 6,338,976 B1 | 1/2002 | Huang | |
| 6,352,876 B1 | 3/2002 | Bordogna | |
| 6,369,417 B1 | 4/2002 | Lee | |
| 6,376,797 B1 | 4/2002 | Piwczyk | |
| 6,383,888 B1 * | 5/2002 | Stirton | 438/401 |
| 6,388,278 B1 | 5/2002 | Suzuki | |
| 6,407,415 B2 | 6/2002 | Lee | |
| 6,433,844 B2 | 8/2002 | Li | |
| 6,482,669 B1 | 11/2002 | Fan | |
| 6,514,810 B1 | 2/2003 | Kim | |

(Continued)

*Primary Examiner* — Alexander Ghyka
(74) *Attorney, Agent, or Firm* — Ding Yu Tan

(57) ABSTRACT

A method for fabricating a semiconductor device includes steps as following. First, a substrate with an edge-mark is provided. The substrate has a front-side surface and a back-side surface opposite to each other. The front-side surface has an active region and a peripheral region with an alignment mark formed thereon. Next, an optical shielding layer is formed over the back-side surface of the substrate. Next, a first photo mask is aligned to the substrate by standing on the edge-mark. Next, a portion of the optical shielding layer corresponding with the alignment mark is removed by using the first photo mask. Next, a second photo mask is aligned to the substrate by standing on the alignment mark. Then, a portion of the optical shielding layer corresponding with the active region is removed to expose a portion of the substrate by using the second photo mask for forming an optical shielding pattern.

9 Claims, 5 Drawing Sheets

U.S. PATENT DOCUMENTS

| | | |
|---|---|---|
| 6,566,151 B2 | 5/2003 | Yeh |
| 6,617,189 B1 | 9/2003 | Chen |
| 6,632,700 B1 | 10/2003 | Fan |
| 6,641,464 B1 | 11/2003 | Steere, III |
| 6,664,191 B1 | 12/2003 | Kim |
| 6,730,555 B2 | 5/2004 | Kim |
| 6,794,215 B2 | 9/2004 | Park |
| 6,821,809 B2 | 11/2004 | Abe |
| 6,841,848 B2 | 1/2005 | MacNamara |
| 6,846,722 B2 | 1/2005 | Lee |
| 6,849,533 B2 | 2/2005 | Chang |
| 6,872,584 B2 | 3/2005 | Nakashiba |
| 6,921,934 B2 | 7/2005 | Patrick |
| 6,933,972 B2 | 8/2005 | Suzuki |
| 6,953,608 B2 | 10/2005 | Leu |
| 6,960,512 B2 | 11/2005 | Cheng |
| 7,006,294 B2 | 2/2006 | Steenblik |
| 7,078,779 B2 | 7/2006 | Wang |
| 7,115,924 B1 | 10/2006 | LaMaster |
| 7,129,172 B2 | 10/2006 | Morrow |
| 7,180,044 B2 | 2/2007 | Yu |
| 7,199,439 B2 | 4/2007 | Farnworth |
| 7,229,745 B2 | 6/2007 | Lamarre |
| 7,315,359 B2 | 1/2008 | Hong |
| 7,328,915 B2 | 2/2008 | Smith |
| 7,498,190 B2 | 3/2009 | Kao |
| 7,648,851 B2 | 1/2010 | Fu et al. |
| 2001/0012593 A1* | 8/2001 | Chang et al. ............... 430/22 |
| 2001/0023086 A1 | 9/2001 | Park |
| 2004/0122328 A1 | 6/2004 | Wang |
| 2005/0024520 A1 | 2/2005 | Yamamoto |
| 2005/0103983 A1 | 5/2005 | Yamaguchi |
| 2005/0121599 A1 | 6/2005 | Mouli |
| 2005/0186739 A1 | 8/2005 | Wang |
| 2005/0247963 A1 | 11/2005 | Chen |
| 2005/0274988 A1 | 12/2005 | Hong |
| 2005/0274996 A1 | 12/2005 | Iwawaki |
| 2006/0054946 A1 | 3/2006 | Baek |
| 2006/0124833 A1 | 6/2006 | Toda |
| 2006/0146230 A1 | 7/2006 | Joon |
| 2006/0146412 A1 | 7/2006 | Kim |
| 2006/0172451 A1 | 8/2006 | Park |
| 2006/0183265 A1 | 8/2006 | Oh |
| 2006/0231898 A1 | 10/2006 | Jeong |
| 2007/0010042 A1 | 1/2007 | Li |
| 2007/0012970 A1 | 1/2007 | Mouli |
| 2007/0018073 A1 | 1/2007 | Hsu |
| 2007/0023851 A1 | 2/2007 | Hartzell |
| 2007/0031988 A1 | 2/2007 | Agranov |
| 2007/0052050 A1 | 3/2007 | Dierickx |
| 2007/0072326 A1 | 3/2007 | Zheng |
| 2007/0096173 A1 | 5/2007 | Kim |
| 2007/0117253 A1 | 5/2007 | Hsu |
| 2007/0158772 A1 | 7/2007 | Boettiger |
| 2007/0166649 A1 | 7/2007 | Yu |
| 2007/0202696 A1 | 8/2007 | Inuiya |
| 2008/0036020 A1 | 2/2008 | Ko |
| 2008/0055733 A1 | 3/2008 | Lim |
| 2008/0079103 A1 | 4/2008 | Liao |
| 2008/0121805 A1 | 5/2008 | Tweet |
| 2008/0121951 A1 | 5/2008 | Kao |
| 2008/0138957 A1* | 6/2008 | Yang ............................ 438/401 |
| 2008/0157144 A1 | 7/2008 | Lee |
| 2008/0169546 A1 | 7/2008 | Kwon |
| 2008/0213936 A1* | 9/2008 | Hatai ............................ 438/60 |
| 2008/0251951 A1* | 10/2008 | Holscher et al. ............. 257/797 |
| 2008/0265348 A1 | 10/2008 | Maas |
| 2008/0283175 A1* | 11/2008 | Hagood et al. ................ 156/145 |
| 2009/0066954 A1 | 3/2009 | Opsal |
| 2009/0121264 A1 | 5/2009 | Kao |
| 2009/0124037 A1 | 5/2009 | Yu |
| 2009/0127643 A1 | 5/2009 | Lu |
| 2009/0134484 A1 | 5/2009 | Lin |
| 2009/0168181 A1 | 7/2009 | Su |
| 2009/0200585 A1 | 8/2009 | Nozaki |
| 2009/0212335 A1 | 8/2009 | Kao |
| 2009/0256258 A1 | 10/2009 | Kreupl |
| 2009/0294888 A1 | 12/2009 | Tsai |
| 2009/0321862 A1 | 12/2009 | Yu |
| 2010/0003623 A1 | 1/2010 | Liu |
| 2010/0038688 A1 | 2/2010 | Wu |
| 2010/0044813 A1 | 2/2010 | Wu |
| 2010/0096359 A1 | 4/2010 | Shiu |
| 2010/0144156 A1 | 6/2010 | Shih |
| 2010/0159632 A1 | 6/2010 | Rhodes |
| 2010/0315734 A1 | 12/2010 | Wu |
| 2010/0330798 A1* | 12/2010 | Huang et al. ................ 438/613 |
| 2011/0057277 A1 | 3/2011 | Yu |

* cited by examiner

METHOD FOR FABRICATING SEMICONDUCTOR DEVICE

BACKGROUND

1. Technical Field

The present invention relates to a method for fabricating semiconductor device, more particularly to a method for fabricating a semiconductor device with good optical yield.

2. Description of the Related Art

As the development of electronic products such as digital cameras and scanners progresses, the demand for image sensors increases accordingly. In general, image sensors in common usage nowadays are divided into two main categories: charge coupled device (CCD) sensors and CMOS image sensors (CIS). Primarily, CMOS image sensors have certain advantages of low operating voltage, low power consumption, and ability for random access. Furthermore, CMOS image sensors are currently capable of integration with the semiconductor fabrication process. Based on those benefits, the application of CMOS image sensors has increased significantly.

The CMOS image sensor separates incident light into a combination of light of different wavelengths. For example, the CMOS image sensor can consider incident light as a combination of red, blue, and green light. The light of different wavelengths is received by respective optically sensitive elements such as photodiodes and is subsequently transformed into digital signals of different intensities. Thus, it can be seen that a monochromatic color filter array (CFA) must be set above every optical sensor element for separating the incident light.

Typically, the color filter array is formed by photolithography process. In order to correctly transfer the patterns on the photo mask onto the substrate where the color filter array determined to be formed thereon, before the exposure process of each photolithography process is performed, it is necessary to perform an alignment process for aligning the photo mask to the substrate so that the improper pattern transfer will not happen. Usually, the alignment mark is formed on the substrate for forming scattering site or diffraction edge during the alignment process. Hence, while a light source is provided to illuminate the wafer, the diffraction patterns caused by the light beam passing by the alignment mark are reflectively projected onto the alignment sensor or onto the first-order diffraction interferometer alignment system.

Furthermore, since the backside image sensor including a color filter array and a lens array formed on backside has been widely used for increasing light sensitivity, how to perform an alignment process during the manufacturing process of the backside image sensor for improving the process yield is an important issue.

BRIEF SUMMARY

In accordance with one aspect of the present invention, a method for fabricating a semiconductor device is provided. The method includes steps as following. First, a substrate with an edge-mark is provided. The substrate has a front-side surface and a back-side surface opposite to each other. The front-side surface has an active region and a peripheral region with an alignment mark formed thereon. Next, an optical shielding layer is formed over the back-side surface of the substrate. Next, a first photo mask is aligned to the substrate according to the edge-mark. Next, a portion of the optical shielding layer corresponding with the alignment mark is removed by using the first photo mask. Next, a second photo mask is aligned to the substrate according to the alignment mark. Then, a portion of the optical shielding layer corresponding with the active region is removed to expose a portion of the substrate by using the second photo mask for forming an optical shielding pattern.

In some embodiments of the present invention, the edge-mark is, for example, a notch.

In some embodiments of the present invention, the method further includes the step of removing a portion of the remained optical shielding layer corresponding to the peripheral region to define a scribe line. In some embodiments of the present invention, the portion of the remained optical shielding layer corresponding to the peripheral region is removed by using the second photo mask to define the scribe line.

In some embodiments of the present invention, at least an optical element has been formed within the active region of the front-side surface of the substrate. In some embodiments of the present invention, the at least one optical element is photoelectric transducer element.

In some embodiments of the present invention, the method further includes the step of forming a color filter layer on the back-side surface of the substrate to cover the optical shielding pattern. In some embodiments of the present invention, the method further includes the step of forming at least one lens on the color filter layer.

In some embodiments of the present invention, the method further includes the step of thinning the substrate from the back-side surface before forming the optical shielding layer.

In accordance with the aforementioned fabricating method of a semiconductor device, a first photo mask can be aligned with the substrate according to an edge-mark and then a portion of an optical shielding layer formed over the back-side surface of the substrate and corresponding to an alignment mark formed on the front-side surface is removed by an etching process using the first photo mask, so that the alignment mark can be detected through the substrate. Therefore, the optical shielding layer can be patterned by an etching process using the second photo mask aligned to the substrate according to the alignment mark.

Since the alignment mark formed on the front-side surface of the substrate can be used without etching the back-side surface of the substrate in the patterning process of the optical shielding layer, the color filter layer may evenly sequentially formed on the back-side surface, and thus the optical yield can be increased.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention is to provide a method for fabricating a semiconductor device to avoid the problems of optical yield lost, meanwhile, the processing accuracy of the semiconductor device can be significantly increased. The present invention will now be described more specifically with reference to the following embodiment for fabricating a semiconductor device 200, such as a MOS image sensor but not limited hereto. It is to be noted that the following descriptions of preferred embodiments of this invention are presented herein for purpose of illustration and description only. It is not intended to be exhaustive or to be limited to the precise form disclosed.

Figure 1A:
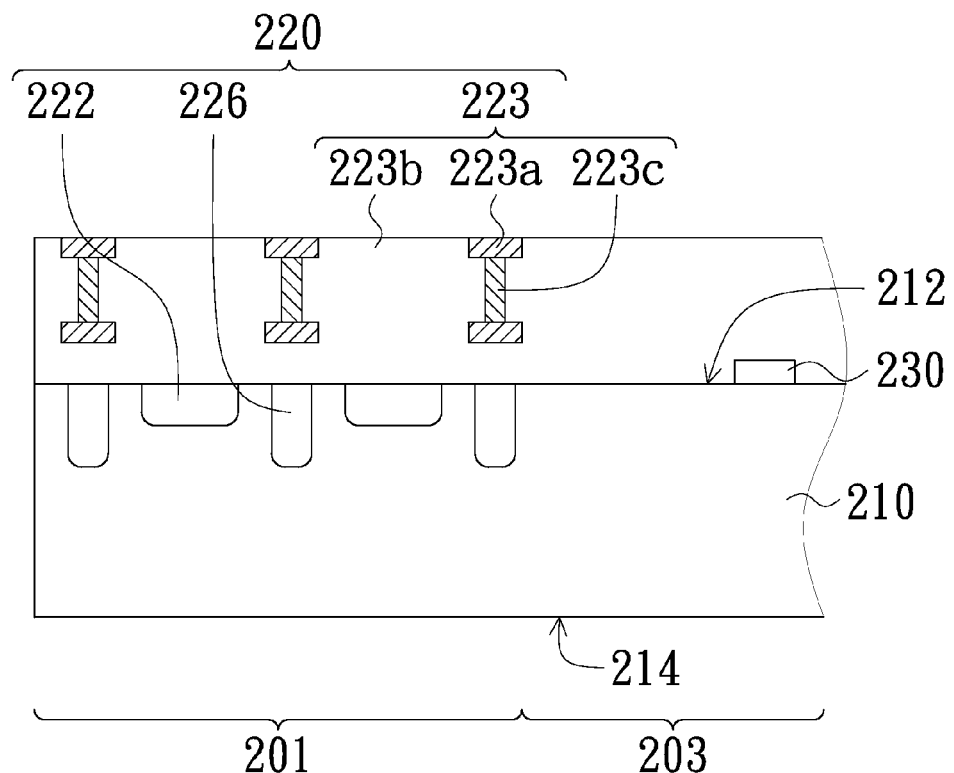
FIGS. 1A to 1E are cross sectional views illustrating a method for fabricating a semiconductor device in accordance with another embodiment of the present invention.

FIGS. 1A to 1E are cross sectional views illustrating a method for fabricating a semiconductor device 200 in accordance with one embodiment of the present invention. As shown in FIG. 1A, a substrate 210 having a front-side surface 212 and a back-side surface 214 opposite of the front-side surface 212 is firstly provided. Further, the front-side surface 212 has an active region 201 and a peripheral region 203. A front-side process is then performed on the front-side surface 212 to form a plurality of optical elements 220 on the active region 201 and an alignment mark 230 on the peripheral region 203. In detail, the optical elements 220 include a plurality of photoelectric transducer devices 222 and an interconnect structure 223 subsequently formed on the front-side surface 212. The interconnect structure 223 electrically connects to the photoelectric transducer devices 222.

Although, the alignment mark 230 is a single mark formed on the substrate 210, in some other embodiments, the alignment mark 230 may comprise a plurality of elements either formed on the substrate 210 or formed in the substrate 210; and the alignment mark 230 may be formed during, prior to or after the front-side process. In other words, the alignment mark 230 comprises any structure which can serve as a mark being aligned during the subsequent processes.

In some preferred embodiments of the present invention, the substrate 210 may be a silicon substrate. In some other embodiments of the present invention, the substrate 210 may be, otherwise, a silicon-on-insulator (SOI). The plurality of the photoelectric transducer devices 222 are divided by a plurality of STIs 226 which are formed on the front-side surface 212 and extending downwards into the substrate 210. The interconnect structure 223 is a stacked structure constituted by a plurality of metal layers 223a stacked in sequence, a dielectric layer 223b used to isolate the metal layers 223a and at least one conductive via 223c used to electrically connect with two of the metal layers 223a.

It should be appreciated that the interconnect structure 223 consisting of the metal layers 223a, the dielectric layer 223b and the conductive via 223c as shown in FIG. 1A is merely illustrative. Various interconnect structures having circuit integrity and line width the same with or different from that of the interconnect structure 223 may be formed by the front-side process.

Figure 1B:
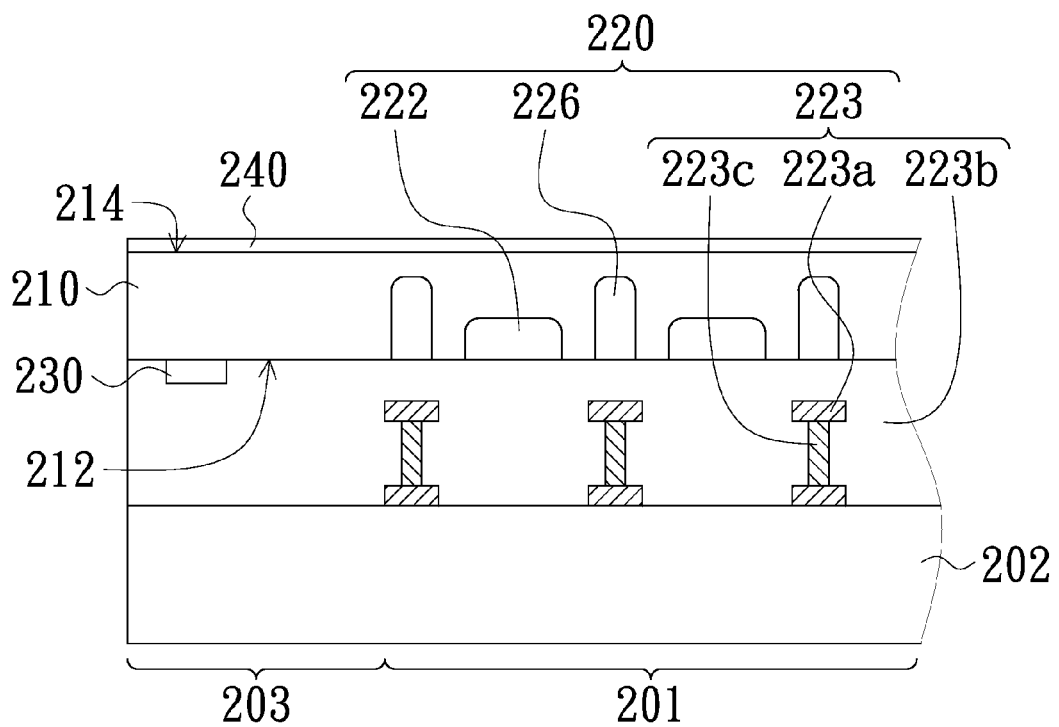

Next, as shown in FIG. 1B, a carrier wafer 202 is bonded above the interconnect structure 223, the substrate 210 is then flipped, and a thinning process is performed on the back-side surface 214 to thin the substrate 210 down to a thickness less or more than 3 μm. The preferred thickness of the thinned substrate 210 may range from 3 μm to 2 μm. Then, an optical shielding layer 240 is formed over the back-side surface 214. In some embodiments of the present invention, the material of the optical shielding layer 240 is, for example, metal.

Figure 1C:
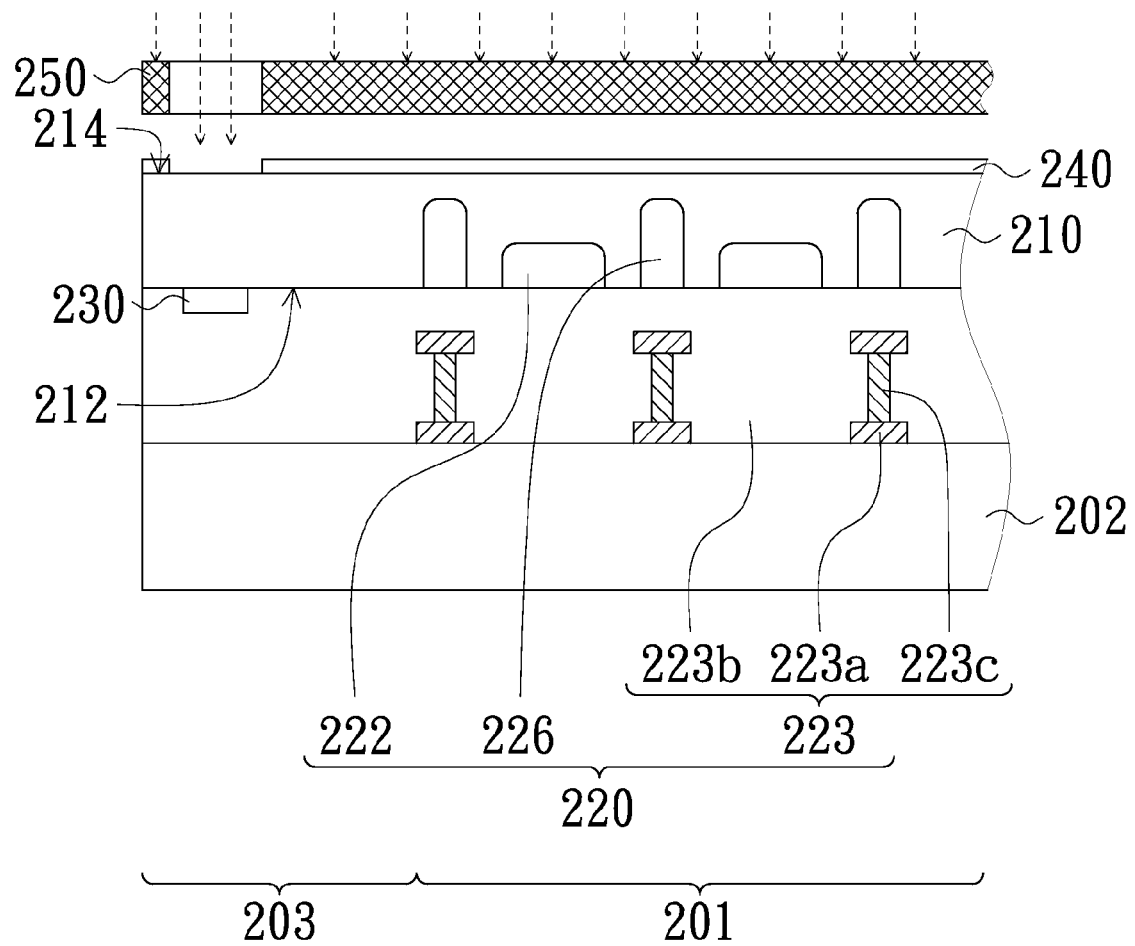
Figure 2:
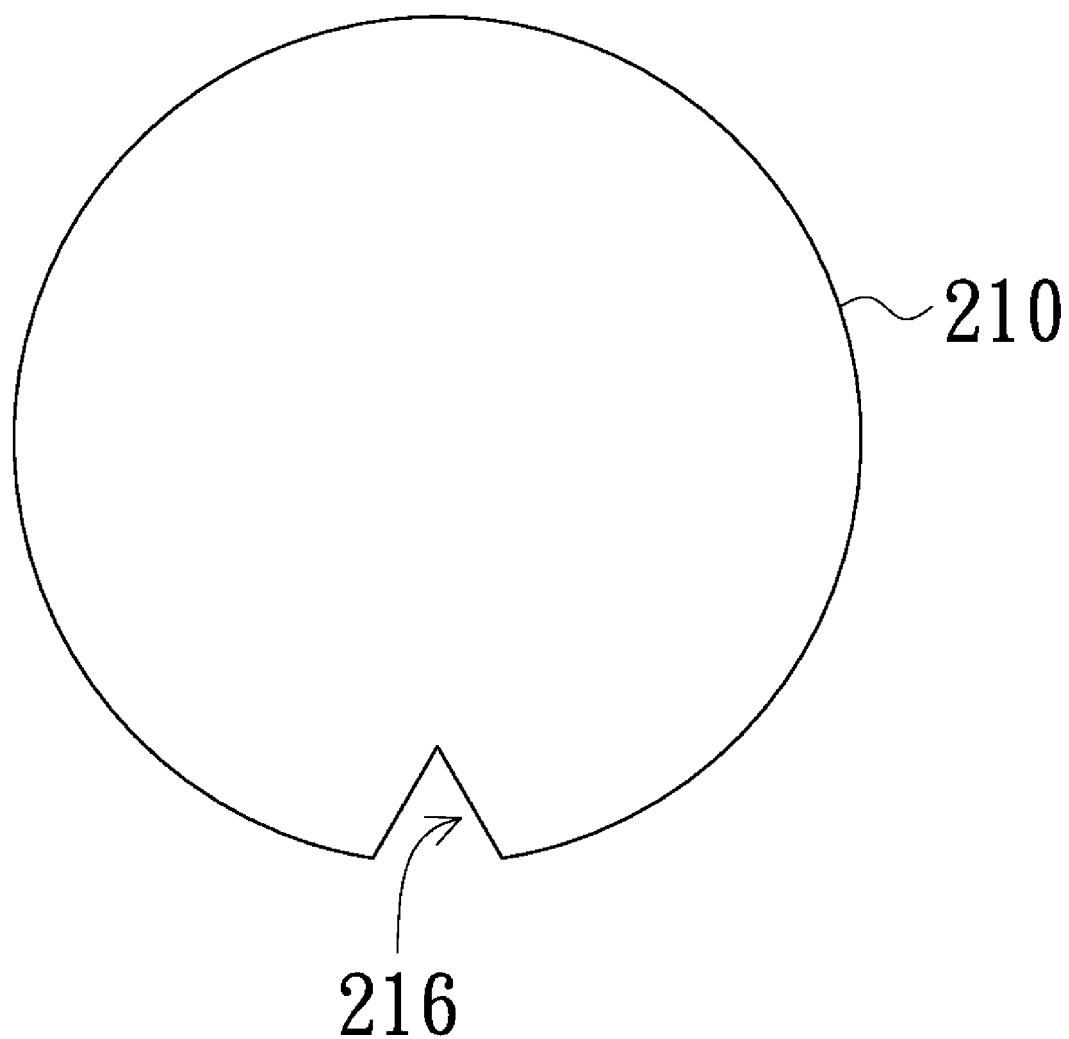
FIG. 2 is a schematic view of a substrate of the semiconductor device in accordance with another embodiment of the present invention.

Specifically, the substrate 210 has an edge-mark 216 (shown in FIG. 2) such as a notch, so that the position of the alignment mark 230 can be roughly determined according to the relative position between the edge-mark 216 and the alignment mark 230 after the optical shielding layer 240 is formed over the back-side surface 214 and the alignment mark 230 is then undetectable through substrate from the back-side surface 214. Accordingly, a first photo mask 250 (shown in FIG. 1C) is then aligned to the substrate 210 according to the edge-mark 216 for performing an etching process to remove a portion of the optical shielding layer 240 corresponding to the peripheral region 203. Therefore, the alignment mark 230 is detectable through substrate 210 from the back-side surface 214.

In some other embodiments of the present invention, the accuracy of using edge-mark 216 to align the first photo mask 250 to the substrate 210 is about 5 μm. Furthermore, the alignment mark 230 may be formed in a scribe line (not shown) of substrate 210. That is, the portion of the optical shielding layer 240 corresponding to the peripheral region 203 can be removed in the process of defining the scribe line, and the first photo mask 250 can be the mask used for defining the scribe line. In general, the scribe line dimension is about 80 μm to 100 μm.

Figure 1D:
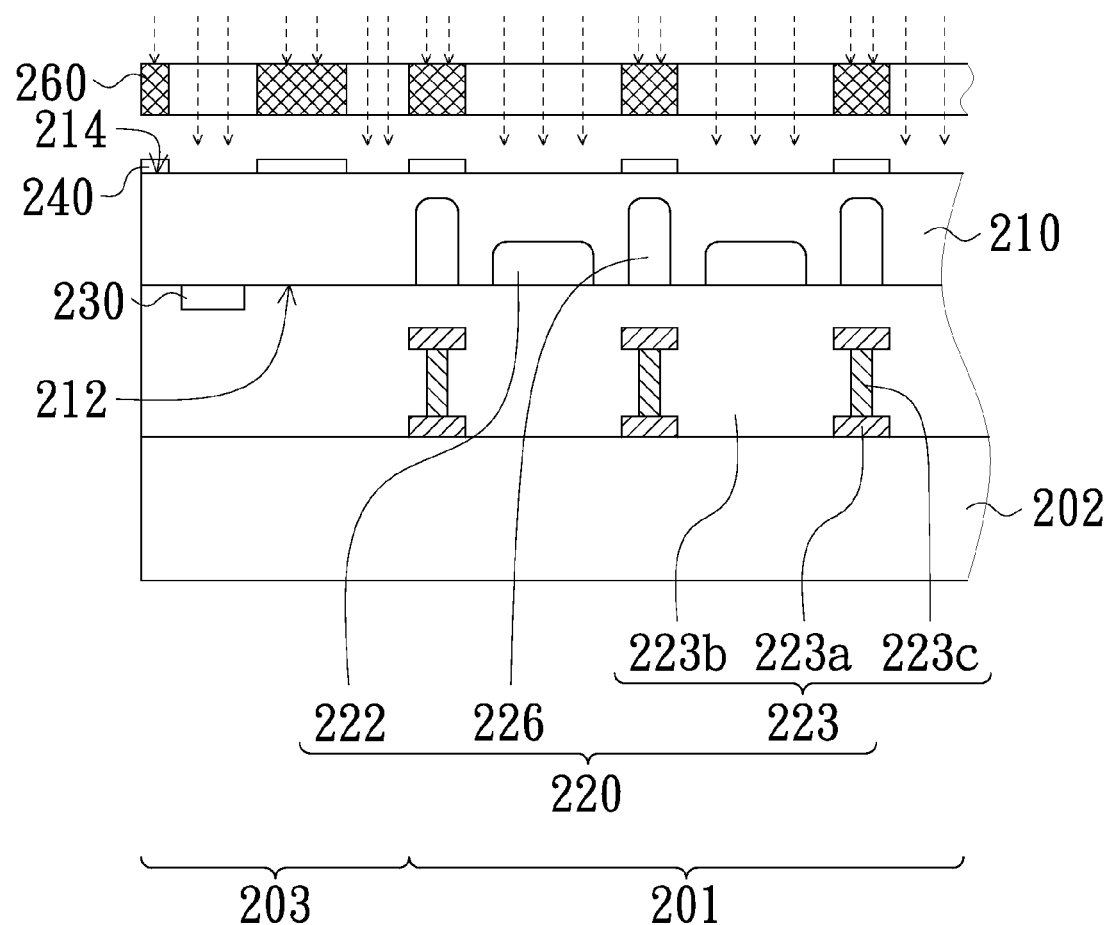

Afterward, as shown in FIG. 1D, a second photo mask 260 is aligned to the substrate 210 according to the alignment mark 230 for performing an etching process to remove a portion of the optical shielding layer 240 corresponding to the active region 201. Specifically, the optical shielding layer 240 is patterned as, for example, a grid.

Moreover, if the scribe line of the substrate 210 is not defined with the etching process shown in FIG. 1C, it also can be defined by removing the remained optical shielding layer 240 corresponding to the peripheral region 203 through the etching process for removing the portion of the optical shielding layer 240 corresponding to the active region 201, but the invention is not limited hereto.

Figure 1E:
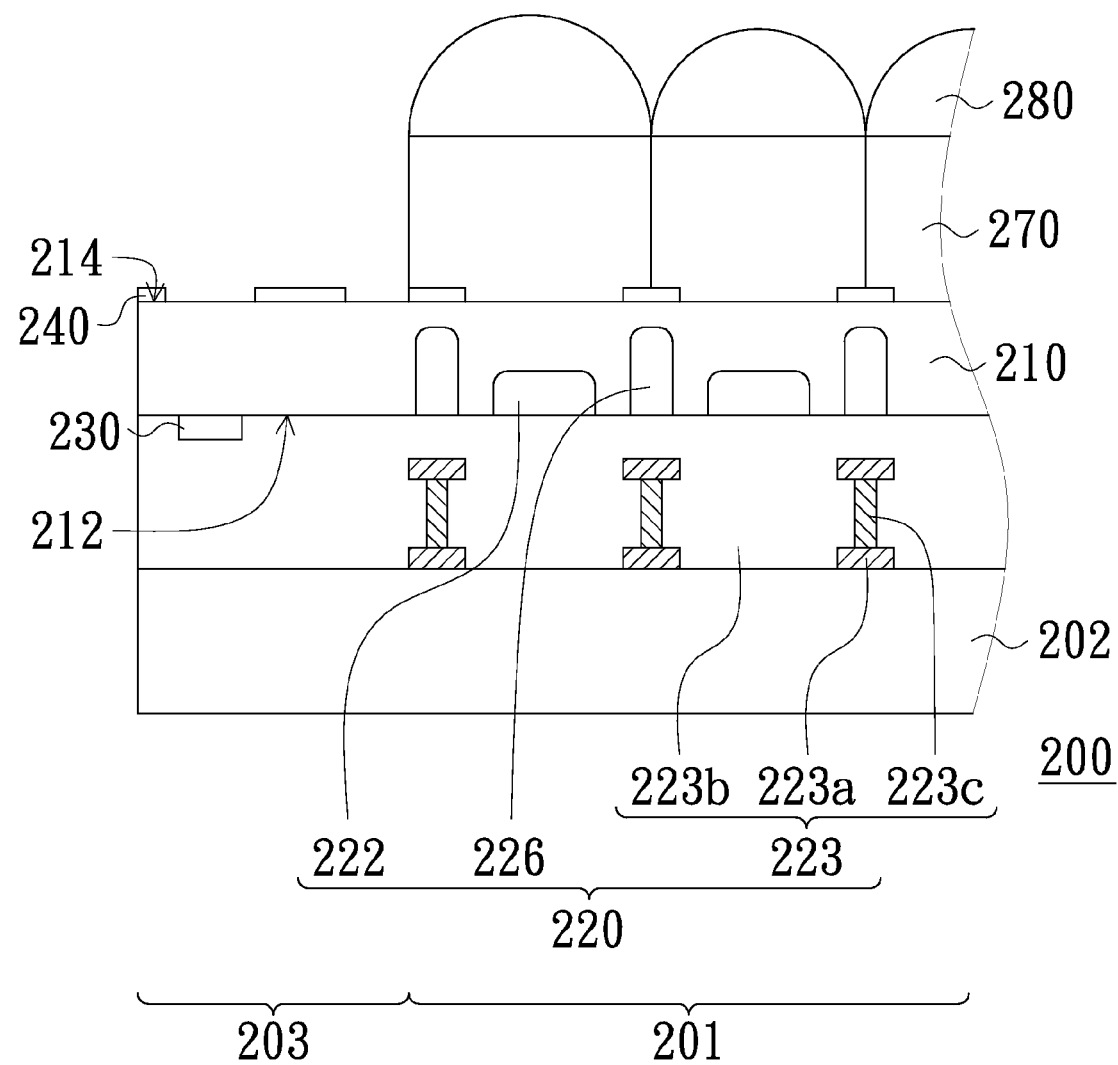

Furthermore, as shown in FIG. 1E, a plurality of color filters 270 and a plurality of lenses 280 are formed on the back-side surface 214 and meanwhile the semiconductor device 200 shown as FIG. 1E is formed.

In accordance with the aforementioned fabricating method of a semiconductor device, a first photo mask can be aligned with the substrate according to an edge-mark and then a portion of an optical shielding layer formed over the back-side surface of the substrate and corresponding to an alignment mark formed on the front-side surface is removed by an etching process using the first photo mask, so that the alignment mark can be detected through the substrate. Therefore, the optical shielding layer can be patterned by an etching process using the second photo mask aligned to the substrate according to the alignment mark.

Since the alignment mark formed on the front-side surface of the substrate can be used without etching the back-side surface of the substrate in the patterning process of the optical shielding layer, the color filter layer may evenly sequentially formed on the back-side surface, and thus the optical yield can be increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a semiconductor device, comprising the steps of:
   providing a substrate with an edge-mark, the substrate has a front-side surface and a back-side surface opposite to each other, the front-side surface has an active region and a peripheral region with an alignment mark formed thereon;

forming an optical shielding layer over the back-side surface of the substrate;

aligning a first photo mask to the substrate according to the edge-mark;

removing a portion of the optical shielding layer corresponding with the alignment mark by using the first photo mask;

aligning a second photo mask to the substrate according to the alignment mark; and removing a portion of the optical shielding layer corresponding with the active region by using the second photo mask to expose a portion of the substrate for forming an optical shielding pattern.

2. The method for fabricating the semiconductor device according to claim 1, wherein the edge-mark is a notch.

3. The method for fabricating the semiconductor device according to claim 1, further comprises the step of removing a portion of the remained optical shielding layer corresponding to the peripheral region to define a scribe line.

4. The method for fabricating the semiconductor device according to claim 3, wherein the portion of the remained optical shielding layer corresponding to the peripheral region is removed by using the second photo mask to define the scribe line.

5. The method for fabricating the semiconductor device according to claim 1, wherein at least an optical element has been formed within the active region of the front-side surface of the substrate.

6. The method for fabricating the semiconductor device according to claim 5, wherein the at least one optical element is photoelectric transducer element.

7. The method for fabricating the semiconductor device according to claim 1, further comprises the step of forming a color filter layer on the back-side surface of the substrate to cover the optical shielding pattern.

8. The method for fabricating the semiconductor device according to claim 7, further comprises the step of forming at least one lens on the color filter layer.

9. The method for fabricating the semiconductor device according to claim 1, further comprises the step of thinning the substrate from the back-side surface before forming the optical shielding layer.

* * * * *